(12) United States Patent
Son et al.

(10) Patent No.: US 9,709,865 B2
(45) Date of Patent: Jul. 18, 2017

(54) LIQUID CRYSTAL DISPLAY PANEL AND METHOD FOR MANUFACTURING THE SAME

(71) Applicant: Samsung Display Co., Ltd., Yongin (KR)

(72) Inventors: Ock-Soo Son, Seoul (KR); Hyun-Wuk Kim, Yongin-si (KR); Sung-In Ro, Hwaseong-si (KR); Jean-Ho Song, Yongin-si (KR); Eun-Je Jang, Hwaseong-si (KR); Sung-Jin Hong, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 121 days.

(21) Appl. No.: 14/645,023

(22) Filed: Mar. 11, 2015

(65) Prior Publication Data

US 2015/0268503 A1    Sep. 24, 2015

(30) Foreign Application Priority Data

Mar. 21, 2014    (KR) .................. 10-2014-0033284

(51) Int. Cl.
*G02F 1/1333* (2006.01)
*G02F 1/1362* (2006.01)
(Continued)

(52) U.S. Cl.
CPC ...... *G02F 1/136227* (2013.01); *G02F 1/1368* (2013.01); *G02F 1/133345* (2013.01);
(Continued)

(58) Field of Classification Search
CPC .................. G02F 1/133345; G02F 1/1368
See application file for complete search history.

(56) References Cited

U.S. PATENT DOCUMENTS 6,724,447 B2 *  4/2004  Kim .................. G02F 1/136213
                                                    349/106
6,900,856 B2    5/2005  Kim et al.
(Continued)

FOREIGN PATENT DOCUMENTS

JP    2002-350899    12/2002
KR    10-2006-0104428    10/2006
(Continued)

*Primary Examiner* — Kendrick Hsu
(74) *Attorney, Agent, or Firm* — H.C. Park & Associates, PLC (57) ABSTRACT

A liquid crystal display panel includes a base substrate, a first step difference compensating pattern, a gate metal pattern, a semiconductor pattern, a source electrode, a drain electrode, a pixel electrode and a color filter. The first step difference compensating pattern is disposed on the base substrate and includes an inorganic material. The gate metal pattern is disposed on the first step difference compensating pattern and includes a gate electrode and a gate line electrically connected to the gate electrode. The semiconductor pattern is overlapped with the gate electrode. The source electrode is electrically connected to the semiconductor pattern. The drain electrode is electrically connected to the semiconductor pattern and is spaced apart from the source electrode. The pixel electrode is electrically connected to the drain electrode. The color filter is overlapped with the pixel electrode.

12 Claims, 10 Drawing Sheets (51) Int. Cl.
*G02F 1/1368* (2006.01)
*H01L 29/786* (2006.01)
*H01L 27/12* (2006.01)

(52) U.S. Cl.
CPC .... *G02F 1/136286* (2013.01); *H01L 27/1218* (2013.01); *H01L 29/78636* (2013.01); *G02F 2001/136222* (2013.01)

(56) References Cited

U.S. PATENT DOCUMENTS

| | | | |
|---|---|---|---|
| 7,773,182 B2 * | 8/2010 | Kimura | G02F 1/134363 349/141 |
| 8,101,467 B2 | 1/2012 | Yamazaki et al. | |
| 2001/0025988 A1 * | 10/2001 | Lee | G02F 1/1368 257/347 |
| 2009/0212286 A1 | 8/2009 | Benzarti | |
| 2012/0113347 A1 * | 5/2012 | Shim | G02F 1/13394 349/43 |

FOREIGN PATENT DOCUMENTS

| | | |
|---|---|---|
| KR | 10-2007-0119235 | 12/2007 |
| KR | 10-0936951 | 1/2010 |
| KR | 10-2010-0089923 | 8/2010 |
| KR | 10-2014-0137922 | 12/2014 |

* cited by examiner

LIQUID CRYSTAL DISPLAY PANEL AND METHOD FOR MANUFACTURING THE SAME

This application claims priority from and benefit under 35 U.S.C. §119(a) of Korean Patent Application No. 10-2014-0033284, filed on Mar. 21, 2014, which is herein incorporated by reference for all purposes as if fully set forth herein.

BACKGROUND

Field

Exemplary embodiments of the present inventive concept relate to a liquid crystal display panel and a method for manufacturing the same, and more particularly, to a liquid crystal display panel with an improved display quality and a method for manufacturing the same.

Discussion of the Background

A liquid crystal display apparatus is a type of a flat panel display FPD, which has been widely used recently. Examples of the flat panel display include, but are not limited to, a liquid crystal display ("LCD"), a plasma display panel ("PDP") and an organic light emitting display ("OLED").

A liquid crystal display apparatus is one of the most widely used types of flat panel displays. The liquid crystal display apparatus applies an electric field to specific molecules of liquid crystal in a liquid crystal cell to convert arrangements of the molecules and change optical characteristics of the liquid crystal cell, such as, for example, birefringence, optical activity, dichroism and light scattering to display an image.

The liquid crystal display apparatus displays an image by using a liquid crystal. The liquid crystal display apparatus is thin, light-weight, and has low power consumption and low driving voltage.

The liquid crystal display apparatus includes a liquid crystal display panel to display an image by using a light transmittance of a liquid crystal.

The liquid crystal display panel may include a color filter on array ("COA") structure or a black matrix on array ("BOA") structure. In the COA structure, a color filter is disposed on a lower surface of a liquid crystal layer. In the BOA structure, a black matrix is disposed on a lower surface of a liquid crystal layer.

A color filter is formed on a substrate, and a portion of the color filter on a source electrode and a drain electrode is eliminated to form a contact hole configured to electrically connect with the drain electrode on the substrate.

An organic layer is formed on the color filter. However, because the organic layer has a liquid characteristic, the middle portion of the color filter is formed to be higher than an edge portion of the color filter.

Thus, an area including the source electrode and the drain electrode may have a step height difference when compared to the surrounding area. When an alignment liquid or a liquid crystal is injected, due to the difference in step height, the alignment liquid or the liquid crystal may have an uneven thickness. Therefore, a stain may occur on the display panel, and a light transmittance and a measure of dispersion of a color coordinate may increase.

SUMMARY

Exemplary embodiments of the present inventive concept provide a liquid crystal display panel with improved a display quality, and the liquid crystal display panel includes a step difference compensating pattern formed on a base substrate by using an inorganic material.

Exemplary embodiments of the present inventive concept also provide a method of manufacturing the above-mentioned liquid crystal display panel.

In accordance with an exemplary embodiment, a liquid crystal display panel includes a base substrate, a first step difference compensating pattern, a gate metal pattern, a semiconductor pattern, a source electrode, a drain electrode, a pixel electrode and a color filter. The first step difference compensating pattern is disposed on the base substrate, and includes an inorganic material. The gate metal pattern is disposed on the first step difference compensating pattern, and includes a gate electrode and a gate line electrically connected to the gate electrode. The semiconductor pattern is overlapped with the gate electrode. The source electrode is electrically connected to the semiconductor pattern. The drain electrode is electrically connected to the semiconductor pattern, and is spaced apart from the source electrode. The pixel electrode is electrically connected to the drain electrode. The color filter is overlapped with the pixel electrode.

In accordance with an exemplary embodiment, a method of manufacturing of a liquid crystal display panel is provided. An inorganic layer is formed by depositing an inorganic material on a base substrate. A gate metal layer is formed on the inorganic layer. A first step difference compensating pattern and a gate metal pattern is formed by patterning the inorganic layer and the gate metal layer. The gate metal pattern includes a gate electrode and a gate line electrically connected to the gate electrode. A semiconductor pattern overlapped with the gate electrode is formed. A source electrode and a drain electrode are formed. The source electrode and the drain electrode are electrically connected to the semiconductor pattern. A color filter is formed on the base substrate. A pixel electrode electrically connected to the drain electrode is formed. The pixel electrode is overlapped with the color filter.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. It will be understood that for the purposes of this disclosure, "at least one of X, Y, and Z" can be construed as X only, Y only, Z only, or any combination of two or more items X, Y, and Z (e.g., XYZ, XYY, YZ, ZZ). Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Figure 1:
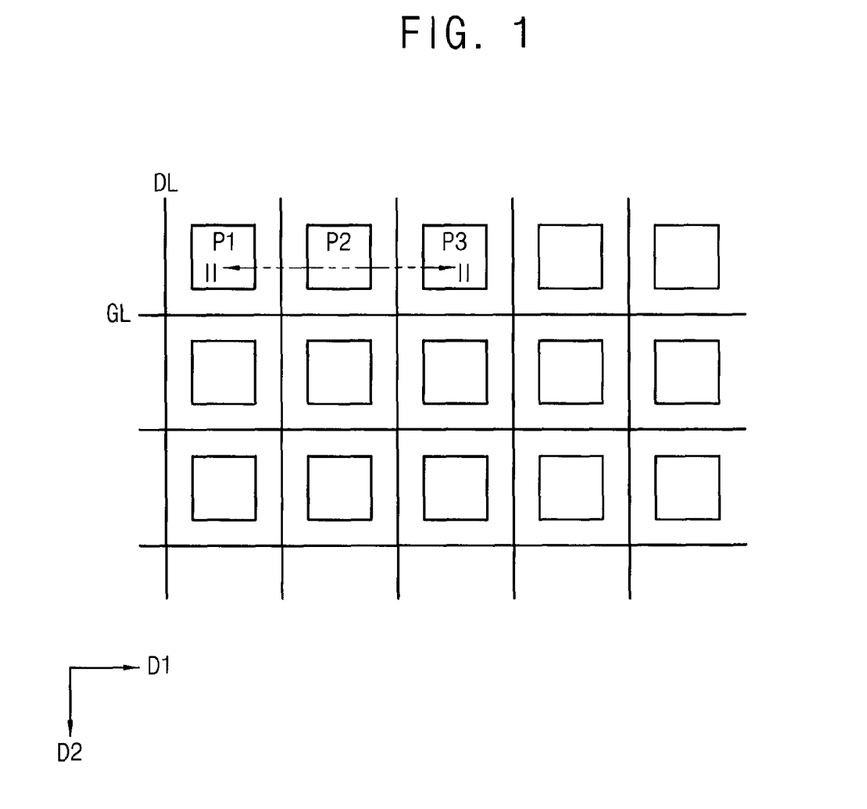
FIG. 1 is a plan view illustrating an exemplary embodiment of a liquid crystal display panel in accordance with the present inventive concept.
Figure 2:
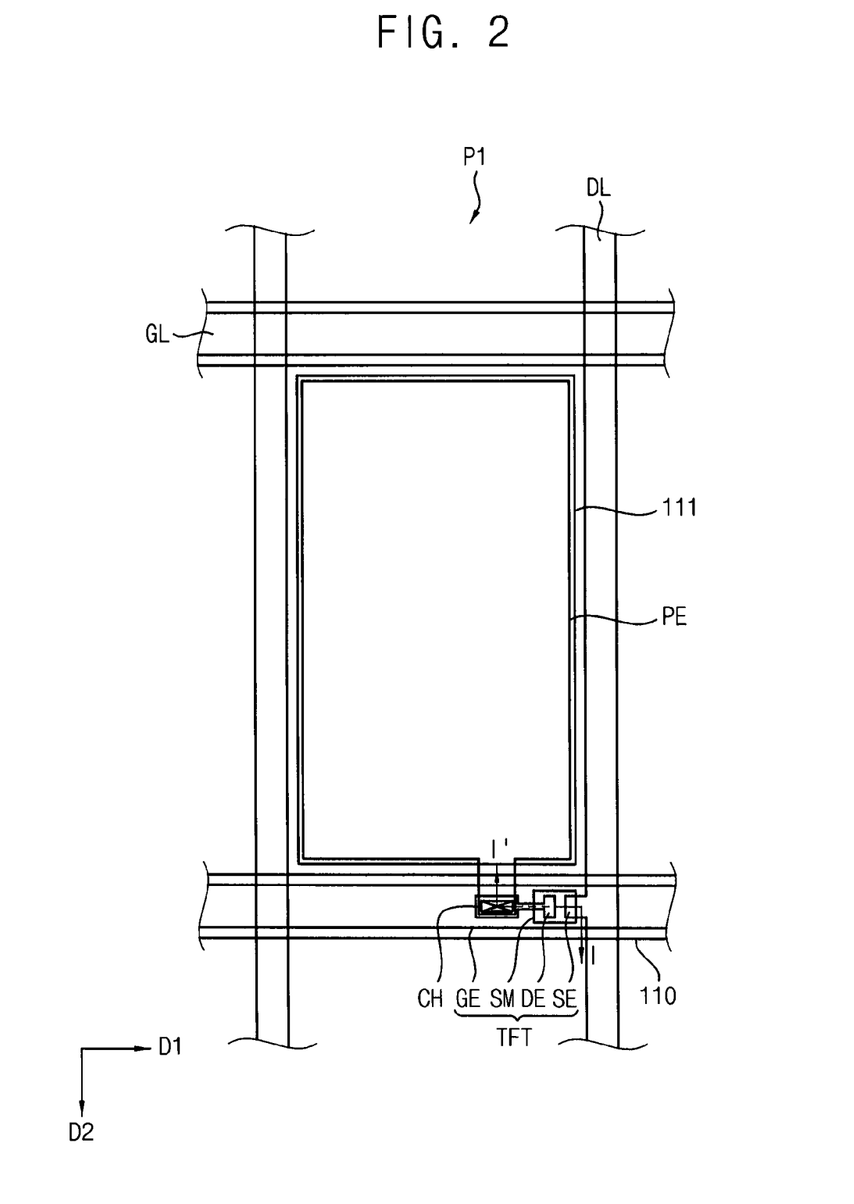
FIG. 2 is plan view illustrating an exemplary embodiment of a first pixel in the display panel in FIG. 1.
Figure 3:
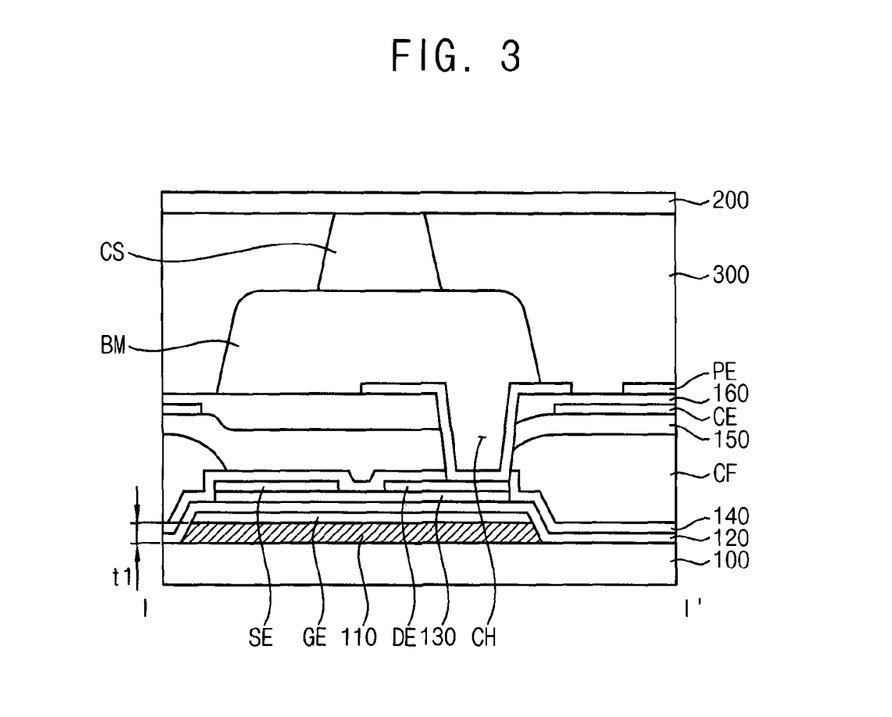
FIG. 3 is a cross-sectional view taken along line I-I' in FIG. 2.
Figure 4:
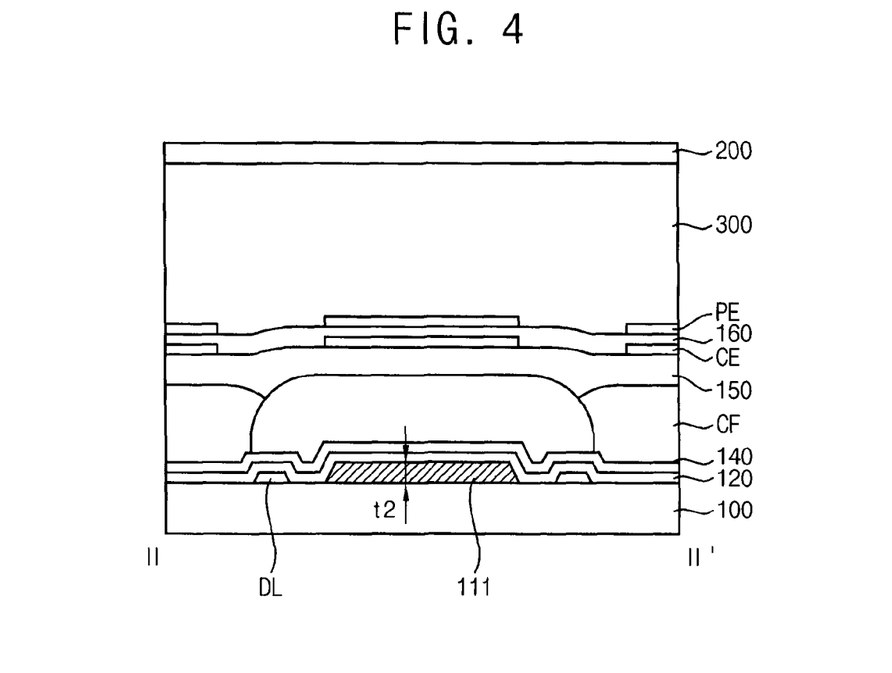
FIGS. 4 and 5 are cross-sectional views taken along line II-II' in FIG. 1.
Figure 5:
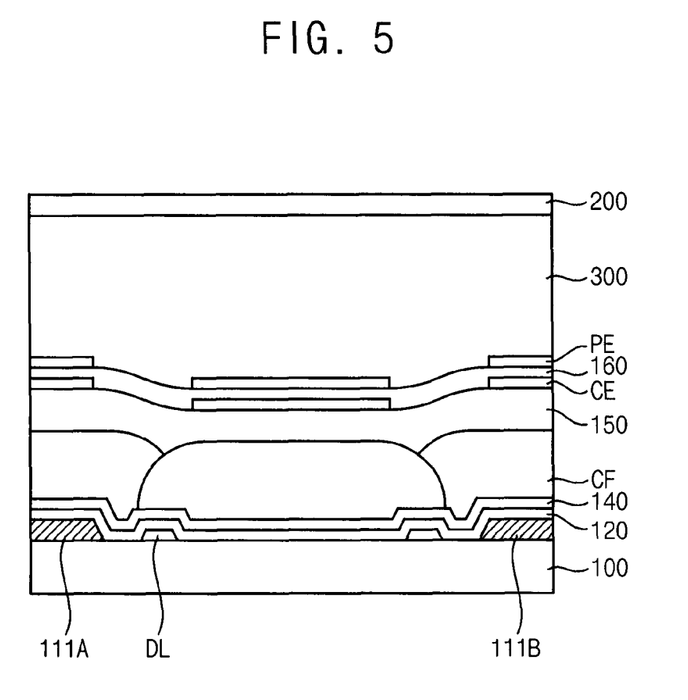

FIG. 1 is a plan view illustrating an exemplary embodiment of a liquid crystal display panel in accordance with the present inventive concept. FIG. 2 is plan view illustrating an exemplary embodiment of a first pixel in the display panel in FIG. 1. FIG. 3 is a cross-sectional view taken along line I-I' in FIG. 2. FIGS. 4 and 5 are cross-sectional views taken along line II-II' in FIG. 1.

Referring to FIG. 1, the display panel includes a plurality of gate lines GL, a plurality of data lines DL and a plurality of pixels including, for example, pixels P1, P2, and P3.

The gate lines GL may extend in a first direction D1. The data lines DL may extend in a second direction D2 crossing the first direction D1. Alternatively, the gate lines GL may extend in the second direction D2 and the data lines DL may extend in the first direction D1.

The pixels may be arranged in a matrix. In an exemplary embodiment, the pixels may be disposed in areas at least partially defined by the gate lines GL and the data lines DL.

Each pixel may be connected to a corresponding gate line GL and a corresponding data line DL adjacent to the pixel.

Each pixel may have a rectangle planar shape elongated in the second direction D2. Alternatively, the pixel may have a V-shape, a Z-shape or the like.

Referring to FIGS. 1 to 5, the display panel includes a base substrate 100, an opposite substrate 200, and a liquid crystal layer 300.

The base substrate 100 may be a transparent insulation substrate. Examples of the transparent insulation substrate may include, but are not limited to, a glass substrate, a plastic substrate, or the like. Examples of the plastic substrate may include, but are not limited to, kapton, polyethersulphone (PES), polycarbonate (PC), polyimide (PI), polyethyleneterephthalate (PET), polyethylenenaphthalate (PEN), polyacrylate (PAR), fiber reinforced plastic (FRP) or the like.

The base substrate 100 may include a plurality of pixel areas for displaying an image. The pixel areas may be disposed in a matrix having a plurality of rows and a plurality of columns.

Each pixel may further include a switching element. In an exemplary embodiment, for example, the switching element may be a thin film transistor TFT. The switching element may be connected to a corresponding gate line GL and a corresponding data line DL adjacent to the switching element. The switching element may be disposed at a crossing area of the gate line GL and the data line DL.

A gate metal pattern may include a gate electrode GE and the gate line GL. The gate metal pattern may be disposed on the base substrate 100. The gate line GL is electrically connected to the gate electrode GE.

A plurality of step difference compensating patterns may be disposed on the base substrate 100. The step difference compensating patterns may include a first step difference compensating pattern 110 and a second step difference compensating pattern 111.

The first step difference compensating pattern 110 may be disposed on the base substrate 100, extending in, for example, the first direction D1.

The gate metal pattern may be disposed on the first step difference compensating pattern 110, so the height of the gate metal pattern may increase. Thus, a step height difference between the gate metal pattern and a color filter CF and an organic layer 150 may decrease.

The first step difference compensating pattern 110 may include an inorganic material. For example, the inorganic material may be, but are not limited to, silicon nitride ($SiN_x$) or silicon oxide ($SiO_x$).

The height t1 of the first step difference compensating pattern 110 may be, for example, within a range of approximately 0.5 um to 0.7 um. When the height t1 of the first step difference compensating pattern 110 is less than 0.5 um, the height of the gate metal pattern may be too short, so the step height difference between the gate metal pattern and the color filter CF may not decrease sufficiently. When the height t1 of the first step difference compensating pattern 110 is above 0.7 um, the thickness of the liquid crystal display panel may be too thick.

The first step difference compensating pattern 110 may contact the entire lower surface of the gate metal pattern. In other words, the gate metal pattern may be disposed entirely on the first step difference compensating pattern 110. Therefore, the first step difference compensating pattern 110 may increase the height of the gate metal pattern.

The second step difference compensating pattern 111 may be further disposed on the base substrate 100. The second step difference compensating pattern 111 may be disposed on at least one pixel.

The second step difference compensating pattern 111 may be disposed between adjacent data lines DL. Therefore, the second step difference compensating pattern 111 may increase the height of the pixel. The second step difference compensating pattern 111 may be disposed below the pixel electrode 111.

The second step difference compensating pattern 111 may be selectively disposed to increase the height of a desired pixel amongst a plurality of pixels. Thus, brightness of each pixel may be controlled without controlling an opening ratio of each pixel.

When the second step difference compensating pattern 111 is disposed in a desired pixel, a cell gap of the desired pixel may decrease. Thus, brightness of the desired pixel may decrease.

In an exemplary embodiment of the present inventive concept, the second step difference compensating pattern 111 may be disposed in a neighboring pixel to a desired pixel to increase the apparent brightness of the desired pixel. A cell gap of the desired pixel may increase when compared to the neighboring pixel, so the brightness of the desired pixel may relatively increase.

The second step difference compensating pattern 111 may include an inorganic material. For example, the inorganic material may be, but are not limited to, silicon nitride ($SiN_x$) or silicon oxide ($SiO_x$).

The height t2 of the second step difference compensating pattern 111 may be, for example, within a range of approximately 0.5 um to 2.0 um. When the height t2 of the second step difference compensating pattern 111 is less than 0.5 um, a brightness of the pixel may not substantially change. When the height t2 of the second step difference compensating pattern 111 is above 2.0 um, an overall thickness of the liquid crystal display panel may increase.

The gate insulation layer 120 may be disposed on the base substrate 100 to cover the gate metal pattern and may insulate the gate metal pattern. The gate insulation layer 120 may be disposed on an entire surface of the base substrate 100.

For example, the gate insulation layer 120 may include, but are not limited to, silicon nitride, silicon oxide, or the like. The gate insulation layer 120 may have a single layer structure or a multi-layers structure. For example, the gate insulation layer 120 may include a lower insulation layer including silicon nitride and an upper insulation layer including silicon oxide.

The data line DL and the switching element may be disposed on the gate insulation layer 120. The switching element may include the gate electrode GE, the source electrode SE, and the drain electrode DE.

A semiconductor pattern 130 may be disposed on the gate insulation layer 120. The semiconductor pattern 130 may overlap the gate electrode GE.

A data metal pattern may include the data line DL, the source electrode SE and the drain electrode DE. The data metal pattern may be disposed on the semiconductor pattern 130, which is disposed on the gate insulation layer 120.

The source electrode SE may be overlapped with the semiconductor pattern 130 and the source electrode SE may be electrically connected to the data line DL. The source electrode SE may also be electrically connected to the semiconductor pattern 130. The drain electrode DE may be spaced apart from the source electrode SE with respect to the semiconductor pattern 130, and may be electrically connected to the semiconductor pattern 130.

The semiconductor pattern 130 may have a conductive channel between the source electrode SE and the drain electrode DE.

A first passivation layer 140 may be disposed on the gate insulation layer 120 to cover the data metal pattern and may insulate the data metal pattern. The first passivation layer 140 may be disposed on the entire surface of the base substrate 100.

The first passivation layer 140 may include an inorganic material. For example, the first passivation layer 140 may include, but are not limited to, silicon nitride, silicon oxide, or the like.

Color filters CF may be disposed on the first passivation layer 140.

The color of light may be changed by the color filters CF, and the light may penetrate the liquid crystal layer 300. Color filters CF may include a red color filter, green color filter, and a blue color filter.

Each of the color filters CF may correspond to one of the pixel areas. Color filters CF, which are adjacent to each other, may have different colors from each other.

In an exemplary embodiment of the present inventive concept, color filters CF may be spaced apart from each other at a border between pixel areas adjacent to each other.

An organic layer 150 may be disposed on the color filters CF.

The organic layer 150 may be formed on the color filters CF, and may flatten an upper surface of the substrate. For example, the degree of flatness of the surface of the organic layer 150 may be equal to or more than 95%. When the flatness is less than 95%, a liquid crystal margin may decrease, and an alignment layer may be uneven, that may cause a stain on the display panel.

The organic layer 150 may include an organic material. For example, the organic layer 150 may include, but are not limited to, benzocyclobutene resin, olefin resin, polyimide resin, acryl resin, polyvinyl resin or the like.

A common electrode CE may be disposed on the organic layer 150.

The common electrode CE may include, for example, a transparent conductive material, such as indium tin oxide ("ITO"), indium zinc oxide ("IZO") and aluminum zinc oxide ("AZO"). The common electrode CE may also have a slit pattern.

A second passivation layer 160 may be disposed on the common electrode CE.

The second passivation layer 160 may include an inorganic material. For example, the second passivation layer 160 may include, but are not limited to, silicon nitride, silicon oxide, or the like.

A pixel electrode PE may be disposed on the second passivation layer 160.

The pixel electrode PE may be electrically connected to the thin film transistor TFT through a contact hole CH. The pixel electrode PE may be disposed on a pixel area. A grayscale voltage may be applied to the pixel electrode PE through the thin film transistor TFT. In an exemplary embodiment, for example, the pixel electrode PE may include a transparent conductive material, such as indium tin oxide ("ITO"), indium zinc oxide ("IZO") and aluminum zinc oxide ("AZO"), and the pixel electrode PE may have a slit pattern.

The grayscale voltage may be applied to the pixel electrode PE and the common electrode CE to form an electric field.

A black matrix BM may be disposed on the second passivation layer 160 and the pixel electrode PE, and the black matrix BM may overlap with the gate metal pattern.

The black matrix BM may include, for example, chromium ("Cr") or chromium oxide ("CrO$_x$").

The black matrix BM may be overlapped with the gate metal pattern extending in a first direction D1, thereby blocking a light. Thus, the black matrix BM may be disposed on a non-display area of the pixel area.

A column spacer CS may be disposed on the black matrix BM to maintain a cell gap.

The opposite substrate 200 may be disposed on the column spacer CS facing the base substrate 100.

The opposite substrate 200 may be a transparent insulation substrate. Examples of the transparent insulation substrate may include, but are not limited to, a glass substrate, a plastic substrate, or the like. Examples of the plastic substrate may include, but are not limited to, kapton, polyethersulphone (PES), polycarbonate (PC), polyimide (PI), polyethyleneterephthalate (PET), Polyethylenenaphthalate (PEN), polyacrylate (PAR), fiber reinforced plastic (FRP) or the like.

The liquid crystal layer 300 may be disposed between the base substrate 100 and the opposite substrate 200.

In an exemplary embodiment, for example, the liquid crystal layer 300 may include a liquid crystal molecule. An alignment of the liquid crystal molecule in the liquid crystal layer 300 may be controlled by an electric field applied between the common electrode CE and the pixel electrode PE. Therefore, a light transmittance of the pixel may be controlled. Alternatively, an electrophoresis layer may be employed instead of the liquid crystal layer 300 in a display panel to display an image.

The liquid crystal display panel may include an alignment layer to align the liquid crystal molecule of the liquid crystal layer 300.

The alignment layer, not shown, may be disposed between the liquid crystal layer 300 and the second passivation layer 160 and between the liquid crystal layer 300 and the opposite substrate 200.

The alignment layer pre-tilts liquid crystal molecules in the liquid crystal layer 300. The alignment layer may be formed using an alignment liquid, which may be first coated on the base substrate 100 and the opposite substrate 200, and then partially removed at room temperature or by heating. The alignment liquid may be coated by a slit coating process, a spin coating process or the like. The alignment liquid may be a combination of an alignment material, such as polyimide PI, and a solvent.

However, the alignment layer may be omitted in accordance with a type of the liquid crystal layer 300 and/or a structure of the pixel electrode PE and the common electrode CE. In an exemplary embodiment, for example, when the pixel electrode PE has a micro slit structure, the liquid crystal molecules may be aligned without the alignment layer, and thus, the alignment layer may be omitted. Alternatively, when a reactive mesogen layer for the liquid crystal alignment is disposed in the display panel, the alignment layer may be omitted.

FIGS. 6A to 6M are cross-sectional views illustrating an exemplary embodiment of a method of manufacturing a display panel taken along line I-I' in FIG. 2, in accordance with the inventive concept.

FIG. 6 illustrates a base substrate 100.

Figure 6A:
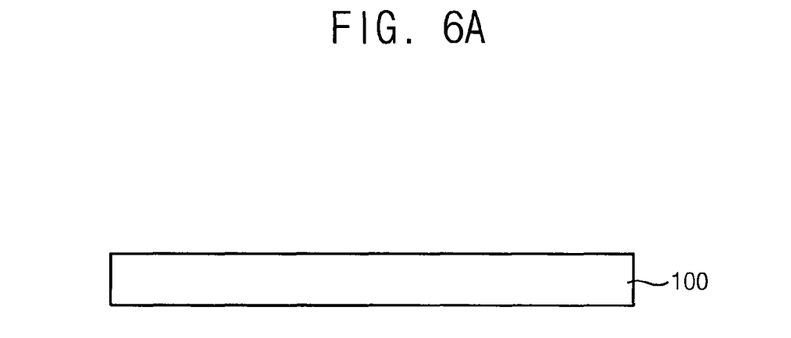
FIGS. 6A to 6M are cross-sectional views illustrating an exemplary embodiment of a method of manufacturing a display panel taken along line I-I' in FIG. 2, in accordance with the present inventive concept.
Figure 6B:
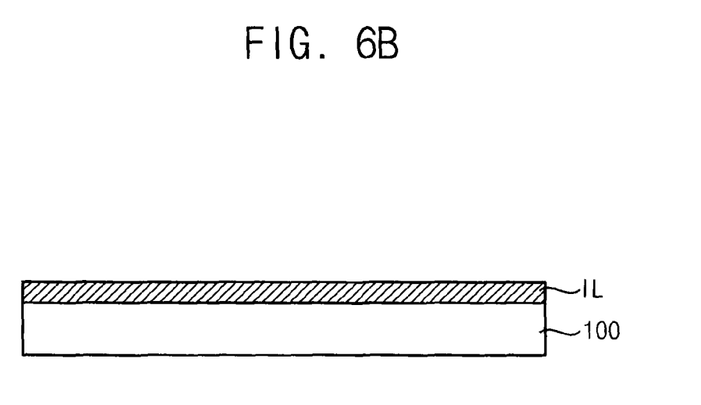

Referring to FIG. 6B, an inorganic layer IL may be formed on the base substrate 100, by depositing an inorganic material.

The inorganic material may be deposited on the base substrate 100 by using, for example, a sputtering process, an atomic layer deposition process, a molecular layer deposition process, a chemical vapor deposition process or the like, thereby forming the inorganic layer IL.

Figure 6C:
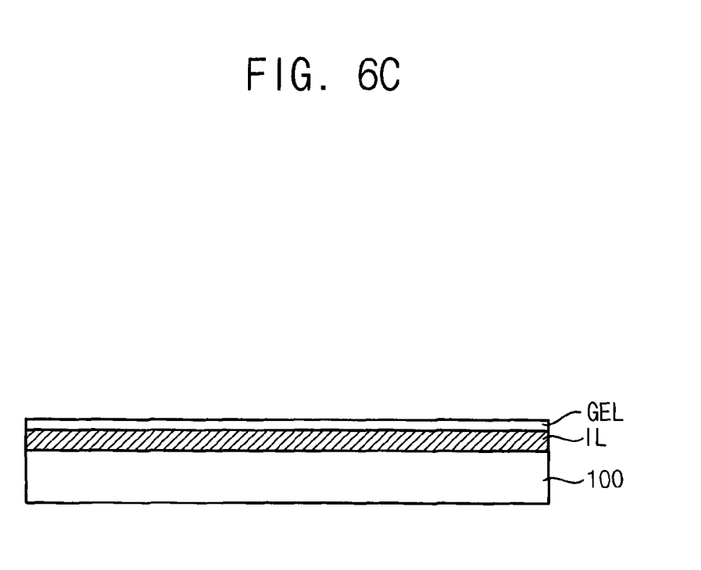

Referring to FIG. 6C, a gate metal layer GEL may be formed on the inorganic layer IL.

Figure 6D:
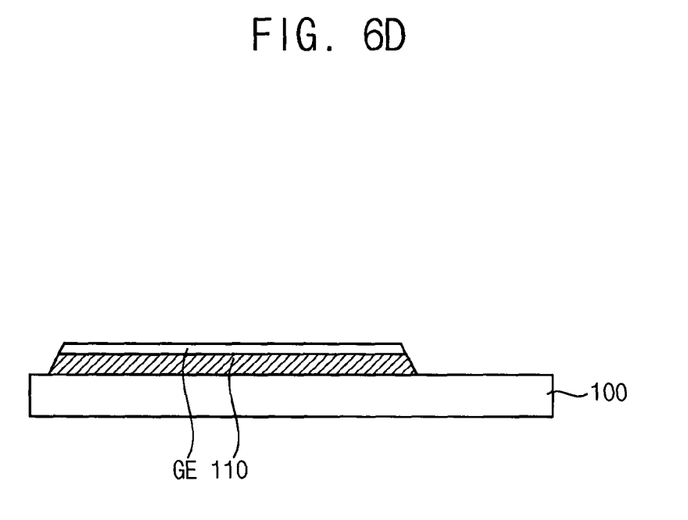

Referring to FIG. 6D, the inorganic layer IL and the gate metal layer GEL may be patterned.

The inorganic layer IL may be patterned, thereby forming a step difference compensating pattern. The step difference compensating pattern may include a first step difference compensating pattern 110 and a second step difference compensating pattern 111. The first step difference compensating pattern 110 and the second step difference compensating pattern 111 may be formed simultaneously.

The gate metal layer GEL may be patterned, thereby forming the gate electrode GE on the step difference compensating pattern.

The inorganic layer IL and the gate metal layer GEL may be patterned by using a dry etching process or a wet etching process.

Therefore, the gate metal pattern may be formed on the first step difference compensating pattern 110.

Figure 6E:
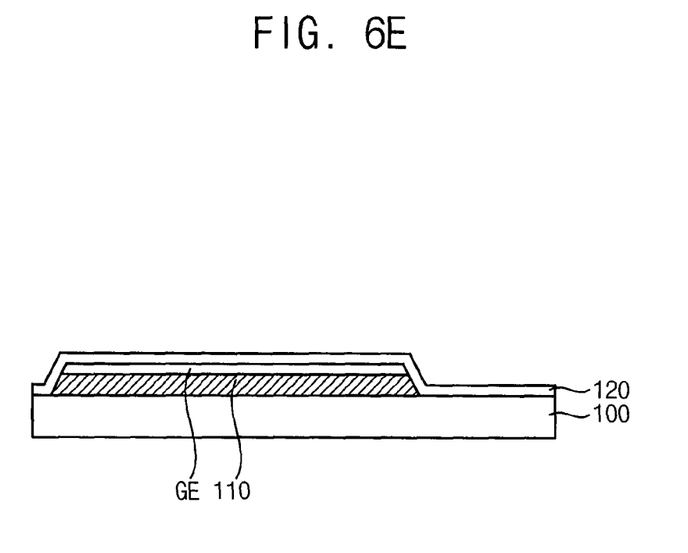

Referring to FIG. 6E, a gate insulation layer 120 may be formed on the step difference compensating pattern 110 and the gate metal pattern GE, which are formed on the base substrate 100.

Figure 6F:
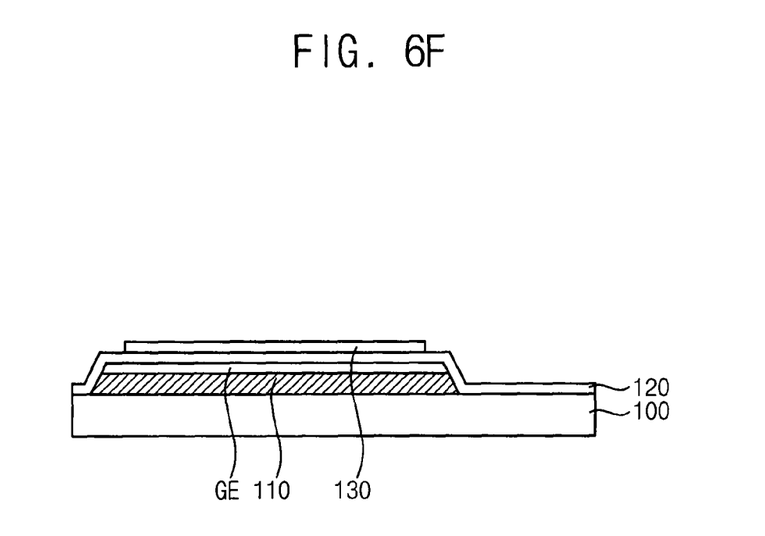

Referring to FIG. 6F, a semiconductor pattern 130 may be formed on the gate insulation layer 120. The semiconductor pattern 130 may include an oxide semiconductor. For example, the oxide semiconductor may include, but are not limited to, zinc oxide (ZnO), zinc tin oxide (ZTO), zinc indium oxide (ZIO), indium oxide (InO), titanium oxide (TiO), indium gallium zinc oxide (IGZO), indium zinc tin oxide (IZTO) or the mixture thereof. The oxide semiconductor may include indium gallium zinc oxide. Because the thin-film transistor including the oxide semiconductor may be formed in a low temperature, it may be suitable for manufacturing a plastic array substrate.

An outer surface of the semiconductor pattern 130 may include a doping area, where n+ type impurity ion or p+ type impurity ion is doped thereon.

The semiconductor pattern 130 may further include as a dopant, such as, for example, lithium (Li), sodium (Na), potassium (K), rubidium (Rb), cesium (Cs), beryllium (Be), magnesium (Mg), calcium (Ca), strontium (Sr), aluminum (Al), barium (Ba), titanium (Ti), zirconium (Zr), hafnium (Hf), vanadium (V), yttrium (Y), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), cadmium (Cd), mercury (Hg), boron (B), gallium (Ga), indium (In), thallium (Tl), silicon (Si), germanium (Ge), tin (Sn), lead (Pb), phosphorus (P), arsenic (As), antimony (Sb), bismuth (Bi), lanthanum (La), cesium (Ce), gadolinium (Gd), neodymium (Nd), tellurium (Te), scandium (Sc), polonium (Po), praseodymium (Pr), terbium (Tb), dysprosium (Dy), holmium (Ho), europium (EU), erbium (Er), ytterbium (Yb), or the mixture thereof.

The semiconductor pattern 130 may be formed by a chemical vapor deposition ("CVD") process or a solution process using a liquid composition.

Figure 6G:
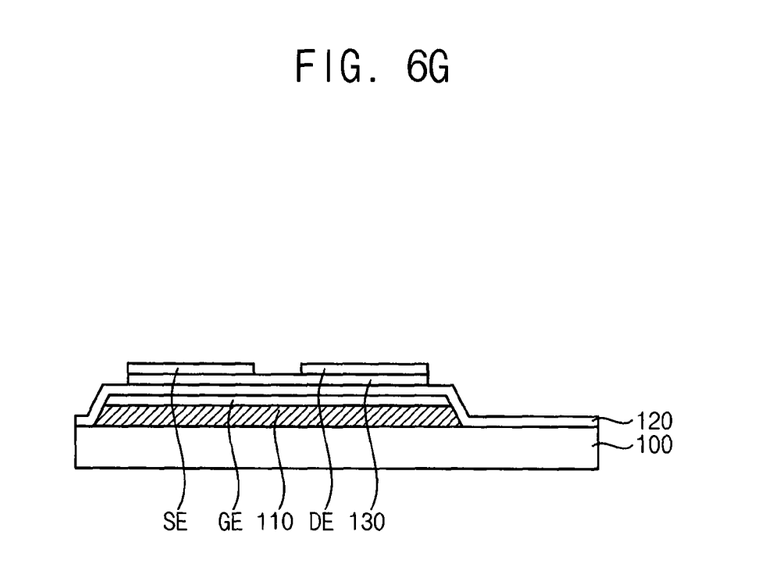

Referring to FIG. 6G, a source electrode SE and a drain electrode DE may be formed on the semiconductor pattern 130.

As illustrated in FIG. 6G, the source electrode SE may overlap with a first edge of the semiconductor pattern 130. The drain electrode DE may overlap with a second edge of the semiconductor pattern 130.

Figure 6H:
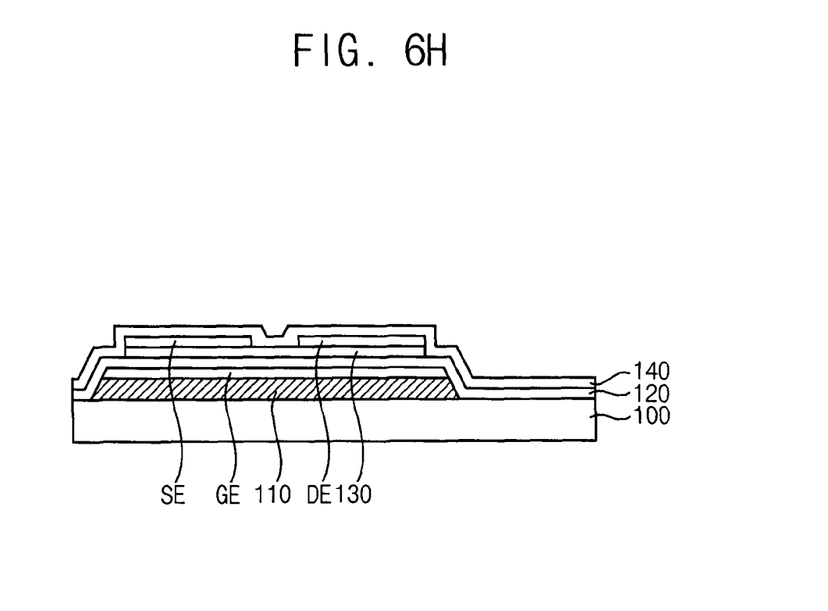

Referring to FIG. 6H, a first passivation layer 140 may be formed on the source electrode SE and the drain electrode DE.

Figure 6I:
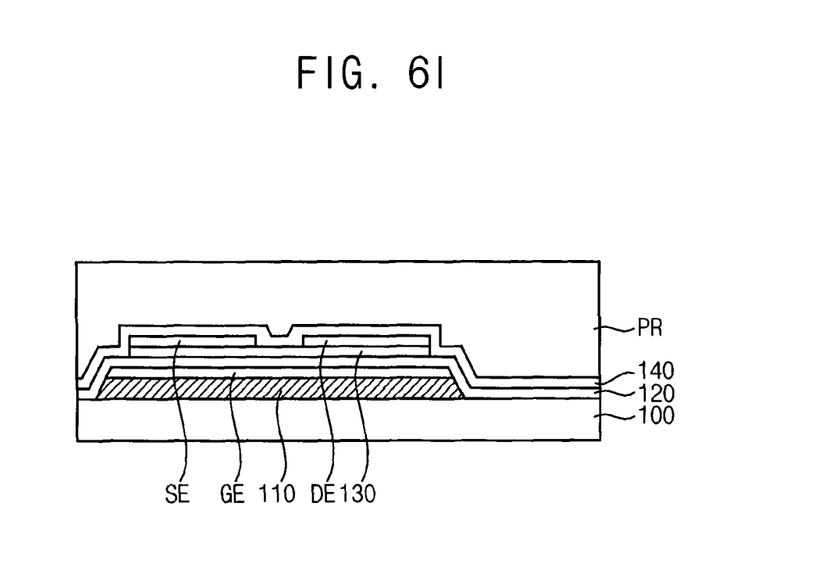

Referring to FIG. 6I, a color filter photoresist PR may be coated on the first passivation layer 140.

Figure 6J:
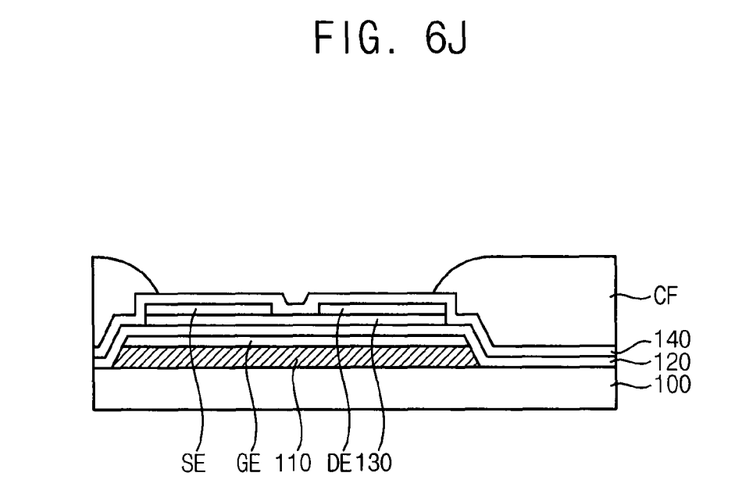

Referring to FIG. 6J, the color filter photoresist PR may be patterned through a mask process to form a color filter CF.

The color filter photoresist PR may be formed on the gate insulation layer 120 and the semiconductor pattern 130. An area, where the photoresist PR overlaps with the semiconductor pattern 130 may be patterned and removed to form the color filter CF. The pixel electrode PE and the drain electrode DE may be electrically connected by removing the overlapping area.

A color filter CF may be formed in each of the pixel areas. Color filters CF, which are adjacent to each other, may have different colors from each other.

Figure 6K:
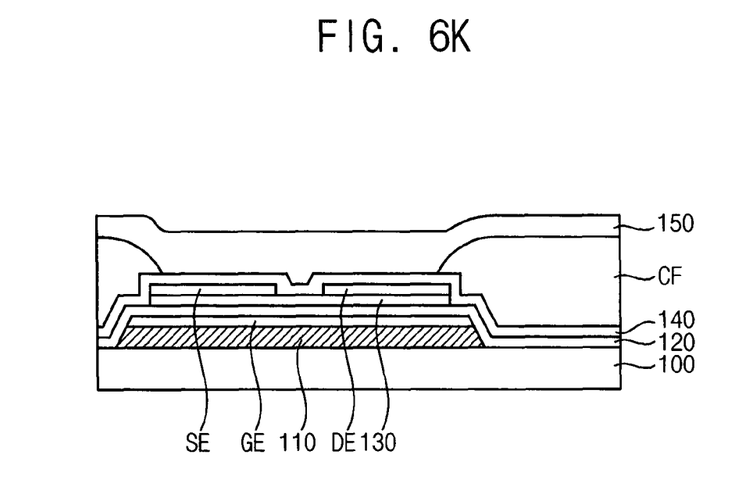

Referring to FIG. 6K, an organic layer 150 may be formed on the color filter CF, so that the organic layer 150 may flatten an upper surface. For example, the degree of the flatness of a surface of the organic layer 150 may be equal to or more than 95%.

Figure 6L:
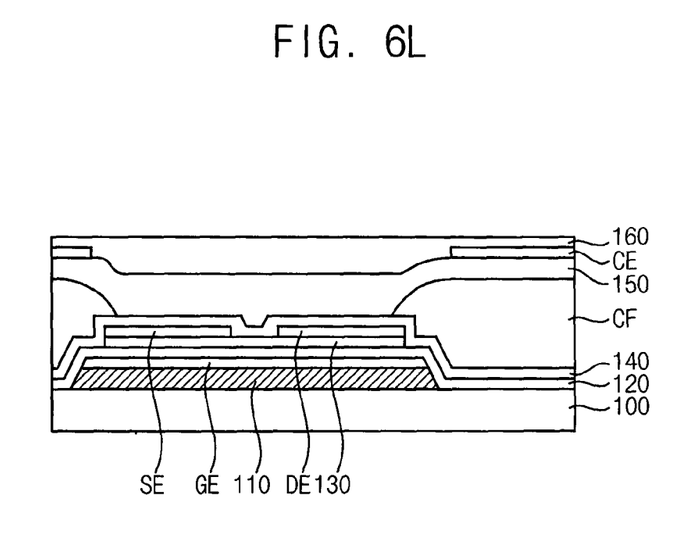

Referring to FIG. 6L, a common electrode CE may be formed on the organic layer 150.

A second passivation layer 160 may be formed on the common electrode CE. The second passivation layer 160 may be formed in a same material with the first passivation layer 140.

Figure 6M:
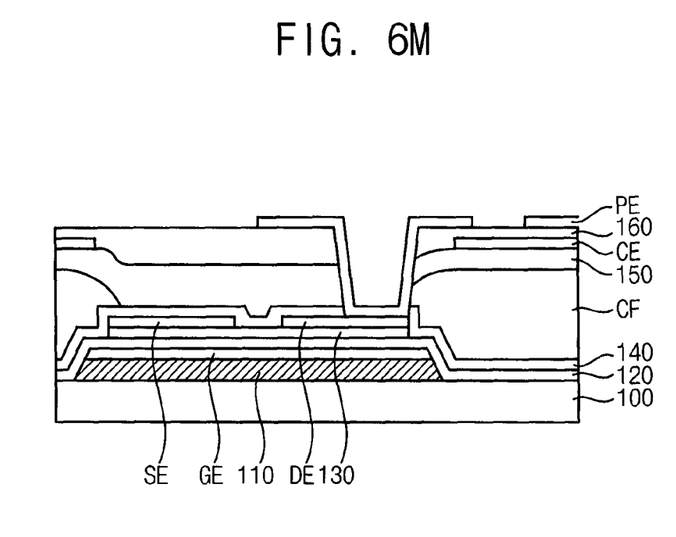

Referring to FIG. 6M, a pixel electrode PE may be formed on the second passivation layer 160.

The pixel electrode PE may be electrically connected with the thin-film transistor TFT through a contact hole CH. The base substrate 100 including the second passivation layer 160 may be patterned prior to forming the pixel electrode PE, so that the drain electrode DE may be exposed. Thus, the pixel electrode PE and the drain electrode DE may be electrically connected.

An opposite substrate 200 may be disposed on the pixel electrode PE. An alignment layer may be formed by injecting an alignment liquid between the base substrate 100 and the opposite substrate 200. The alignment liquid may be, for example, polyimide. A liquid crystal layer 300 may be formed by injecting a liquid crystal between the base substrate 100 and the opposite substrate 200.

In accordance with one or more exemplary embodiments of the present inventive concept, the liquid crystal display panel and the method may apply to, for example, a liquid crystal display apparatus or an organic electroluminescent apparatus.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative, and it is intended that the present invention cover the modifications and variations of this invention provided they come within the scope of the appended claims and their equivalents.

What is claimed is:

1. A liquid crystal display panel comprising:
   a base substrate;
   a first step difference compensating pattern disposed on the base substrate, the first step difference compensating pattern comprising an inorganic material;
   a gate metal pattern disposed on the first step difference compensating pattern, the gate metal pattern comprising a gate electrode and a gate line electrically connected to the gate electrode;
   a semiconductor pattern overlapped with the gate electrode;
   a source electrode electrically connected to the semiconductor pattern;
   a drain electrode electrically connected to the semiconductor pattern and spaced apart from the source electrode;
   a pixel electrode electrically connected to the drain electrode;
   a second step difference compensating pattern disposed on the substrate, in a same layer as the first step difference compensating pattern, and overlapping with the pixel electrode; and
   a color filter overlapped with the pixel electrode.

2. The liquid crystal display panel of claim 1, wherein the inorganic material comprises at least one of silicon nitride and silicon oxide.

3. The liquid crystal display panel of claim 1, wherein a thickness of the first step difference compensating pattern is ranges from 0.5 um to 0.7 um.

4. The liquid crystal display panel of claim 1, further comprising a data line crossing the gate line.

5. The liquid crystal display panel of claim 1, wherein the gate metal pattern is disposed within the perimeter of the first step difference compensating pattern.

6. The liquid crystal display panel of claim 1, wherein the color filter is formed in an island-pattern.

7. The liquid crystal display panel of claim 1, further comprising:
- an organic layer disposed on the semiconductor pattern and the color filter; and
- a common electrode disposed on the organic layer.

8. The liquid crystal display panel of claim 7, wherein the organic layer comprises a contact hole through which the pixel electrode and the drain electrode are electrically connected.

9. The liquid crystal display panel of claim 7, wherein a flatness of the organic layer is at least 95%.

10. The liquid crystal display panel of claim 1, further comprising a gate insulation layer disposed on the gate metal pattern.

11. The liquid crystal display panel of claim 1, further comprising a black matrix overlapped with the gate metal pattern.

12. The liquid crystal display panel of claim 11, further comprising a column spacer disposed on the black matrix and configured to maintain a cell gap of the liquid crystal display panel.

* * * * *